United States Patent [19]
Ishikawa et al.

[11] Patent Number: 5,618,350
[45] Date of Patent: Apr. 8, 1997

[54] PROCESSING APPARATUS

[75] Inventors: Kenji Ishikawa, Sagamihara; Junichi Arami, Tokyo, both of Japan

[73] Assignee: Tokyo Electron Limited, Tokyo, Japan

[21] Appl. No.: 619,245

[22] Filed: Mar. 21, 1996

[30] Foreign Application Priority Data

Mar. 23, 1995 [JP] Japan .................................. 7-091672

[51] Int. Cl.$^6$ .................................................. C23C 16/00
[52] U.S. Cl. ........................... 118/725; 118/728; 118/500; 156/345
[58] Field of Search ...................... 118/725, 728, 118/500; 156/345

[56] References Cited

U.S. PATENT DOCUMENTS

| | | | |
|---|---|---|---|
| 5,063,031 | 11/1991 | Sato | 118/725 |
| 5,231,690 | 7/1993 | Soma | 118/725 |
| 5,280,156 | 1/1994 | Niori | 118/725 |
| 5,310,452 | 5/1994 | Doki | 118/723 MP |
| 5,342,471 | 8/1994 | Fukasawa | 118/723 E |

*Primary Examiner*—Richard Bueker
*Attorney, Agent, or Firm*—Oblon, Spivak, McClelland, Maier & Neustadt, P.C.

[57] ABSTRACT

A receptacle terminal is provided at a mount table and comprised of a downwardly opened electroconductive cap member. The receptacle terminal is connected to a heating element of a heater. A plug terminal is forced into the receptacle terminal and has an electroconductive section, support section and insulating pipe. The insulating pipe is provided around the circumference of the support section. A first clearance is defined between the support section and the inner wall of the insulating pipe. A second clearance is defined between the end face of the electroconductor section and that of the insulating pipe. The lower end portions of the support section and insulating pipe extend out of a processing chamber via a hole in the bottom plate of the processing chamber. A gas supply attachment is provided around the circumference of the insulating pipe and has a cavity including the circumferential portion of the insulating pipe and communicating with a gas supply pipe. The cavity communicates with the first clearance via a hole partially provided in the insulating pipe at the cavity. The gas supply pipe communicating with the cavity is connected to an inert gas supply source. The inert gas is supplied from an inert gas supply source to a region near a contacting area of the receptacle terminal and plug terminal past the cavity, first clearance and second clearance.

8 Claims, 4 Drawing Sheets

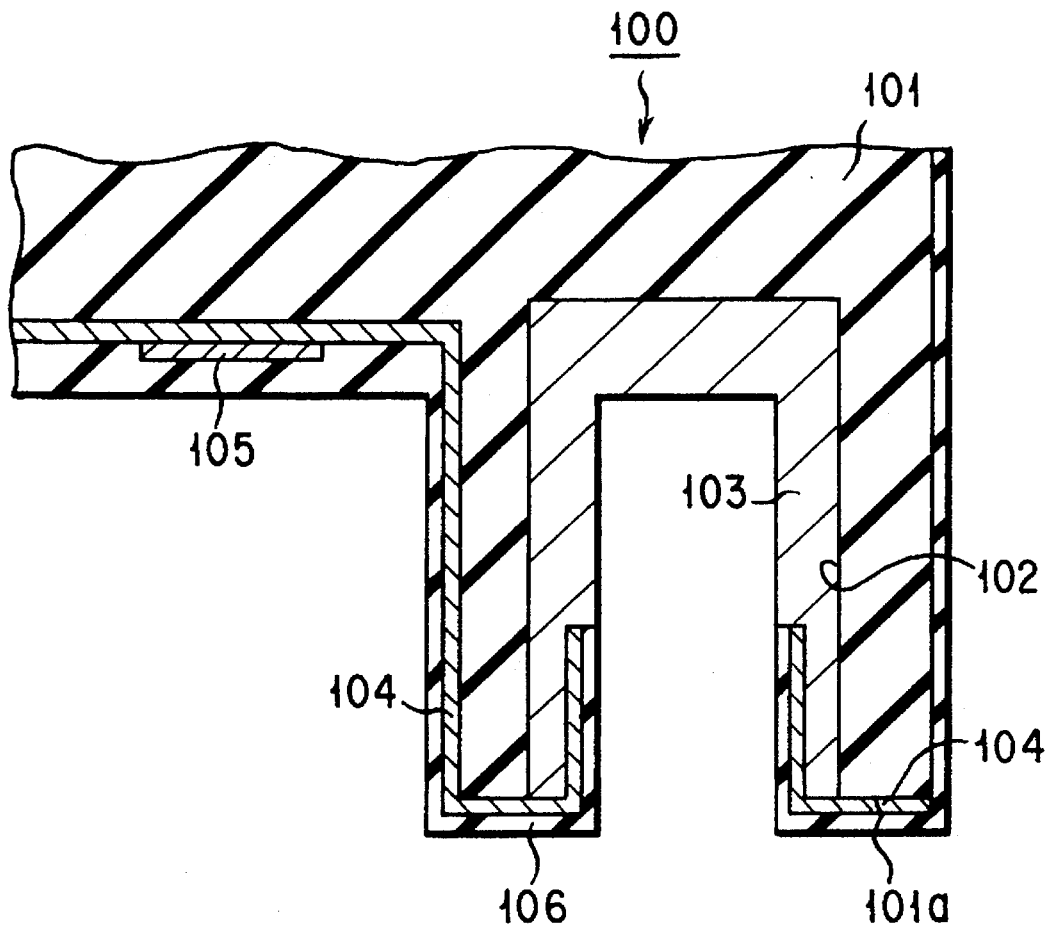
F I G. 6

PROCESSING APPARATUS

BACKGROUND OF THE INVENTION

1. Field of the Invention

The present invention relates to a processing apparatus for performing processing on an object, such as, forming a film thereon, in the manufacturing process of a semiconductor device and, in particular, to a vacuum processing apparatus.

2. Description of the Related Art

In the process of manufacturing a semiconductor wafer, a one-by-one type CVD apparatus is used as a thin-film forming apparatus for forming an insulating film and silicon thin film on the surface of a semiconductor wafer. Such one-by-one type CVD apparatus has a hermetically sealed processing chamber for forming a film in a vacuum atmosphere and a mount table arranged within the processing chamber to hold the wafer in place. An electrostatic chuck is provided at the upper surface of the mount table to attract the semiconductor wafer in place through the utilization of an electrostatic force.

The electrostatic chuck is of such a type as to have a sandwich structure with a thin electroconductor covered at its upper and lower surfaces with an insulating layer. The electrostatic chuck holds the wafer in place under a coulomb force or Johnsen-Rahbeck force generated upon the application of a DC voltage to the electroconductor.

Further, the CVD apparatus calls for the in-plane uniformity, that is, an evenness of a temperature distribution in a plane of a to-be-processed object, from the standpoint of securing the uniformity of a film formed. To this end, a heating device has been provided for heating the to-be-processed object to a suitable temperature in the processing chamber. As such heating device use has been made a one which is provided on the lower surface side of the mount table in a position spaced from the electrostatic chuck and is adapted to transmit heat which is generated from a heating element of the heating device to that overlying electrostatic chuck by heat-conduction.

It has been required that electric power be fed from a high-voltage power source to the electrostatic chuck. To the heating element for heating the to-be-processed object it has been necessary to feed a large electric power, that is, a high electric current coming from a high-voltage power source. As the processing is done under a vacuum atmosphere as set out above, a discharge is liable to occur across the electroconductors in the CVD film forming apparatus.

In the case where an electric power is fed to the electrostatic chuck or the heating device from that electric power source provided outside the processing chamber, a receptacle terminal for instance is provided at the mount table and, by forcing a plug terminal which is electrically connected to the power source into the receptacle, the plug terminal is set in electrical contact with contacts provided on the inside of the receptacle terminal.

For this reason, a discharge is liable to occur between a contacting area of the receptacle terminal's contact and plug terminal, on one hand, and other conductors in the processing chamber on the other.

Therefore, there may be the cases where various kinds of source gases intrude into a circumferential atmosphere around the contacting area of the receptacle terminal and remains there. As a result, various reaction products are deposited on the inner wall of the receptacle terminal near the contacting area and on the circumference of the plug terminal. Depending upon the kinds of source gases an electroconductive reaction product such as polysilicon is produced. A leak current is produced, through such an electroconductive reaction product, between the contacting area and the conductors in the processing chamber and there is a possibility that the electrostatic chuck and heating device will fail to operate due to no adequate power supply to them. Further, there is also possibility that the receptacle terminal and plug terminal will corrode due to the reaction product and that the inside of the processing chamber will be contaminated due to the separation of the reaction product.

SUMMARY OF THE INVENTION

It is accordingly the object of the present invention to provide a processing apparatus which can suppress the intrusion of a process gas into an atmosphere around a contacting area of electrically contacted receptacle terminal and plug terminal to prevent the deposition of any reaction product at and near the contacting area, the generation of any leak current, the corrosion of the receptacle terminal, etc., and the contamination of the inside of the processing chamber.

That is, according to the present invention there is provided a processing apparatus comprising:

a processing chamber for processing an object in a vacuum;

a mount member provided in the processing chamber and having an object placing surface;

an electric power receiving unit for receiving an electric power upon the processing of the object;

a receptacle terminal having a recess and contacts provided in the recess and electrically connected to the electric power receiving unit;

a plug terminal capable of being forced into the recess of the receptacle terminal and electrically connected to the contact when being forced into the recess of the receptacle terminal; and inert gas supplying means for supplying an inert gas to a region near a mutually contacting area of the contact of the receptacle terminal and plug terminal.

BRIEF DESCRIPTION OF THE DRAWINGS

FIG. 6 is a cross-Sectional view showing a variant of a mount table of a CVD apparatus of the present invention.

DETAILED DESCRIPTION OF THE PREFERRED EMBODIMENT

Figure 1:
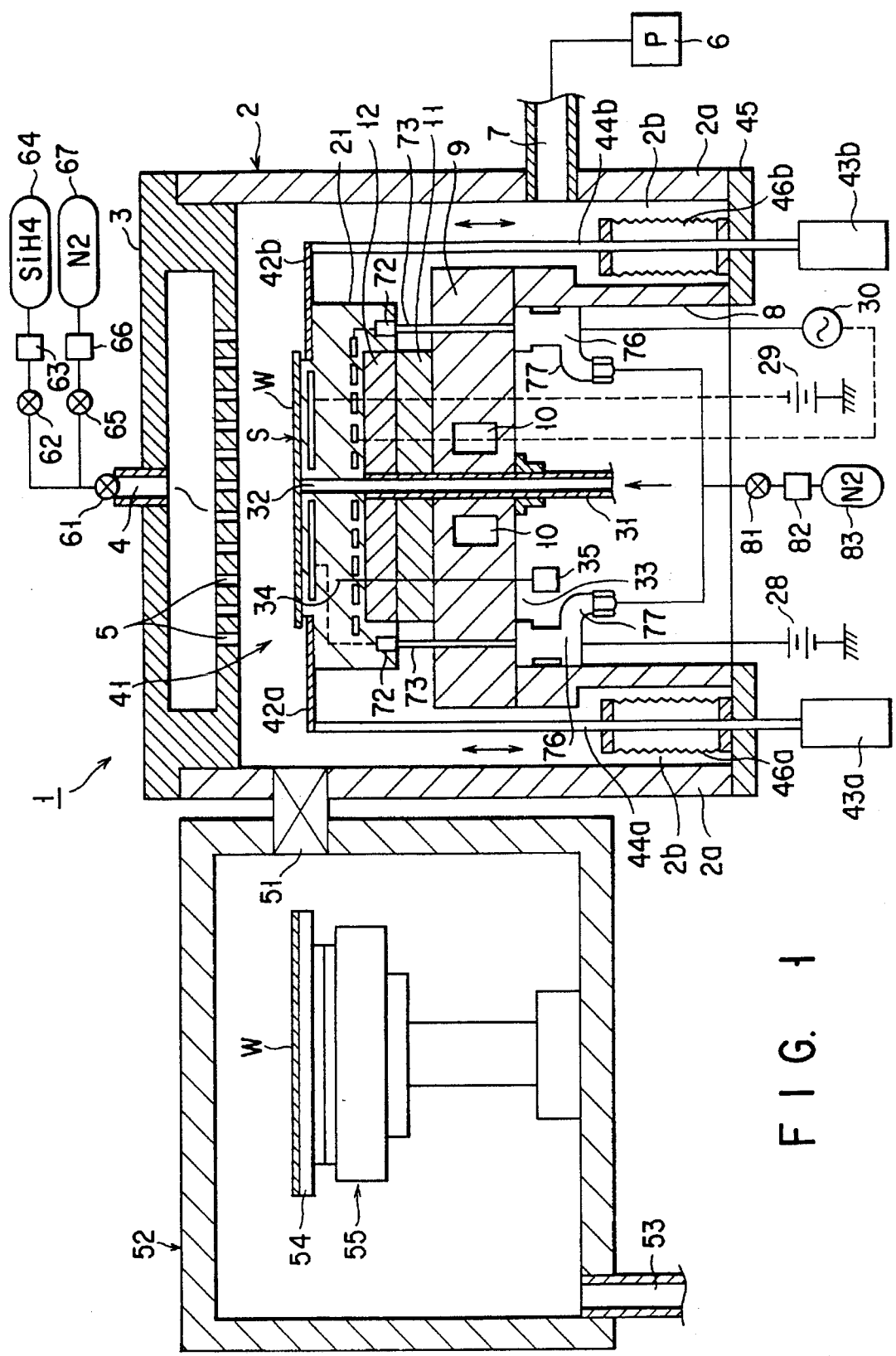
FIG. 1 is a cross-sectional view showing, as a model, a cold-walled, one-by-one type CVD apparatus according to an embodiment of the present invention.

FIG. 1 is a cross-sectional view showing, as a model, a one-by-one type cold-walled CVD apparatus according to an embodiment of the present invention. The CVD apparatus 1 has a substantially cylindrical processing chamber 2 formed at an airtight way. A mount table 21 is located within the processing chamber 21 to position a semiconductor wafer W, as a to-be-processed object, thereon.

A hollow cylindrical shower head 3 is hermetically provided at an upper surface of the processing chamber 2. A process gas introducing tube 4 is provided at the upper surface portion of the shower head 3 to introduce a process gas. A greater number of exhaust holes 5 are provided in the shower head on a side opposed to the mount table 21. The process gas introducing tube 4 is connected to a first process gas supply source 64 to supply a silane ($SiH_4$) gas through a mass flow controller 63 and valves 62, 61. Similarly, the process gas introducing tube 4 is connected to a second process gas supply source 67 to supply a nitrogen ($N_2$) gas through a mass flow controller 66 and valves 65 and 61.

A mixed gas, for example, of $SiH_4$ from the first process gas supply source 64 and $N_2$ from the second process gas supply source 67 is supplied, as a process gas, into a hollow chamber of the shower head 3 through the process gas introducing tube 4 and uniformly directed toward the mount table 21 in the processing chamber 2 via the exhaust holes 5.

An exhaust tube 7 leading to an exhaust means 6 such as a vacuum pump is provided at the bottom of the processing chamber 2 and beside the side wall of the processing chamber 2. Through the operation of the exhaust means 6 the processing chamber 2 can be maintained to a predetermined reduced-pressure atmosphere, for example, to a level $10^{-6}$ Torr.

A bottom section of the processing chamber 2 is comprised of a bottom plate 9 supported by a substantially cylindrical support 8. A cooling water reservoir 10 is provided inside the bottom plate 9 and the cooling water is supplied from a cooling water supply source, not shown, past a cooling water pipe into the cooling water reservoir 10 from which the cooling water is discharged through a discharge pipe, not shown.

Figure 2:
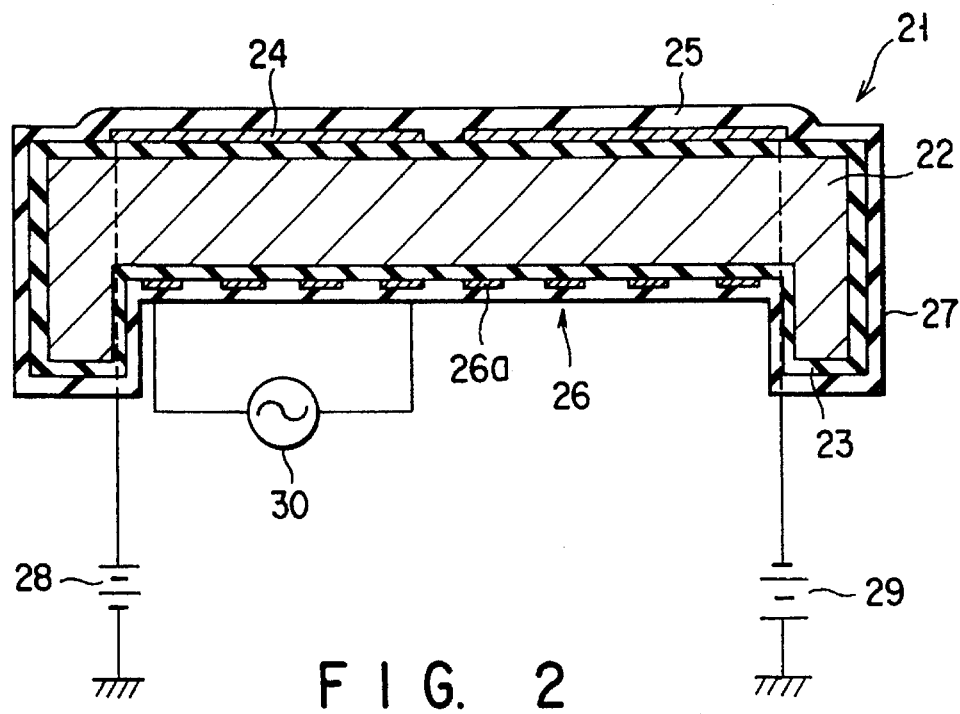
FIG. 2 is a cross-sectional view showing a mount table of the CVD apparatus as shown in FIG. 1.
Figure 3:
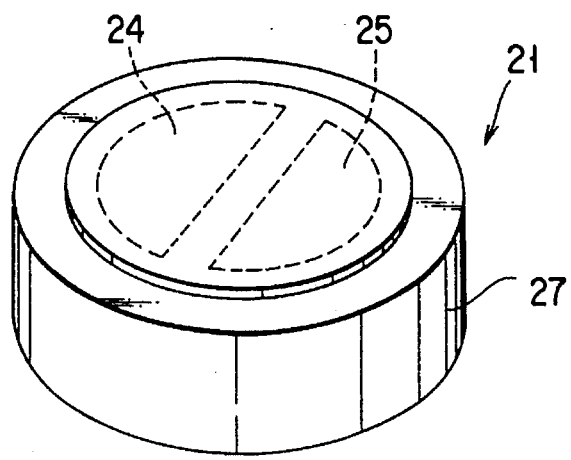
FIG. 3 is a perspective view showing the mount table of the CVD apparatus as shown in FIG. 1.

The mount table 21 is supported by support members 11 and 12 over the upper surface of the bottom plate 9. As shown in FIGS. 2 and 3, the mount table 21 comprises a base member 22, first insulating layer 23 provided on the surface of the base member 22, thin electro-conductors 24, 25 provided on the upper surface of the first insulating layer 23 and second insulating layer 27 provided so as to cover the first insulating layer 23, electroconductors 24, 25 and heater 26.

The base member 22 has a substantially disk-like form of, for example 280 mm in diameter and of a constant thickness and is made of an electroconductor such as carbon (C) and boron nitride (BN). The first insulating layer 23 provided on the surface of the base member 22 is comprised of a thin film formed by a CVD processing, that is, a film of, for example, pyrolitic boron nitride (P-BN), silicon oxide ($SiO_2$), aluminum nitride (AlN), alumina ($Al_2O_3$) or silicon nitride (SIN).

The electroconductors 24, 25 on the upper surface of the first insulating layer 23 have a substantially circular configuration as shown in FIG. 3 and are independently connected to DC high-voltage power sources 28 and 29 of mutually different polarities provided outside the processing chamber 2. The first and second insulating layers 23 and 27 and electroconductor 24 and 25 provide a so-called bipolar type electrostatic chuck S.

The heater 26 on the surface of the first insulating layer 23 of the lower surface side of the mount table 21 has a substantially spiral band-like heating element 26a of a spiral heat generation pattern with a proper radial spacing and generates heat at a predetermined temperature, for example, at any temperature of 400° C. to 1200° C., through an AC power source 30 provided outside the processing chamber 2. In this connection it is to be noted that, in place of the spiral heating element, a plurality of heating elements may be provided in a concentric array with a proper spacing provided there.

Like the first insulating layer 23, these electroconductors 24, 25 and the second insulating layer 27 on the surface of the heater 26 are each formed as a thin film in the CVD processing, that is, a film of P-BN, $SiO_2$, AlN, $Al_2O_3$, or SiN.

The mount table 21 is located over the bottom plate 9 within the processing chamber 2 as set out above and, as shown in FIG. 1, a heat transmitting medium supply tube 31 is so provided as to extend through the center area-of the bottom plate 9 and a passage 32 is provided to lead to the heat transmitting medium supply tube 31. The heat transmitting medium, such as a He gas, is supplied from outside the processing chamber 2 via the heat transmitting medium supply tube 31 and passage 32 to the rear surface of the wafer W on the mount table 21.

Further, a temperature sensor 33 is provided on the mount table 21 and includes a sensing section 34 provided in a base member 22 and a measuring sector 35. The temperature is measured at the measuring section 35 successively on the basis of a signal sensed by the sensing section 34 and a corresponding signal coming from the measuring section 35 is input to a controller, not shown. Based on the signal coming from the temperature sensor 33 the controller sends a control signal to the AC power source 30 of the heater 26, a cooling water supply source, etc., so that the output of the heater 26, flow amount, etc., are controlled and hence the mount surface of the mount table 21 is controlled to a predetermined temperature level.

Within the processing chamber 2 a lifter 41 is so mounted as to lift the semiconductor wafer W away from the mount table 21 and lower it onto the mount table 21. The lifter 41 comprises a pair of mount members 42a, 42b, a pair of drive mechanisms 43a, 43b for driving the mount members 42a, 42b and a pair of support rods 44a, 44b for supporting the mount members 42a, 42b relative to the drive mechanisms 43a, 43b.

The drive mechanisms 43a, 43b are comprised of, for example, a motor or a cylinder and disposed below the processing chamber 2. The support rods 44a, 44b vertically extend into an annular spacing 2b provided between the side surfaces of the bottom plate 9 and support 8, on one hand, and a side wall 2a of the processing chamber 2 on the other.

As shown in FIG. 1, the support rods 44a, 44b extend through an annular support plate 45 hermetically closing the bottom zone of the annular spacing 2b and are connected to the drive mechanism 43a, 43b, so that the support rods 44a, 44b are moved up and down by the actions of the drive mechanisms.

Bellows 46a, 46b are provided on the support plate 45 at those upper surface areas through which the support rods 44a, 44b extend. The hermetical seal is ensured by these bellows 46a, 46b in the processing chamber 2.

A load lock chamber 52 is provided at the side wall of the processing chamber. 2 in a manner to be hermetically sealed by a gate valve 51. The inside of the load lock chamber 52 is evacuated from an exhaust tube 53 provided at its bottom area and, like the processing chamber 2 as set out above, can be maintained to a predetermined reduced-pressure atmosphere, for example, to a level $10^{-6}$ Torr.

A conveying apparatus 55 equipped with a conveying arm 54 is provided within the load lock chamber 52 to allow the conveying arm 54 to pass a wafer W between a cassette in a cassette storage chamber, not shown, adjacently provided via the gate valve and the mount table 21 in the processing chamber 21.

Figure 4:
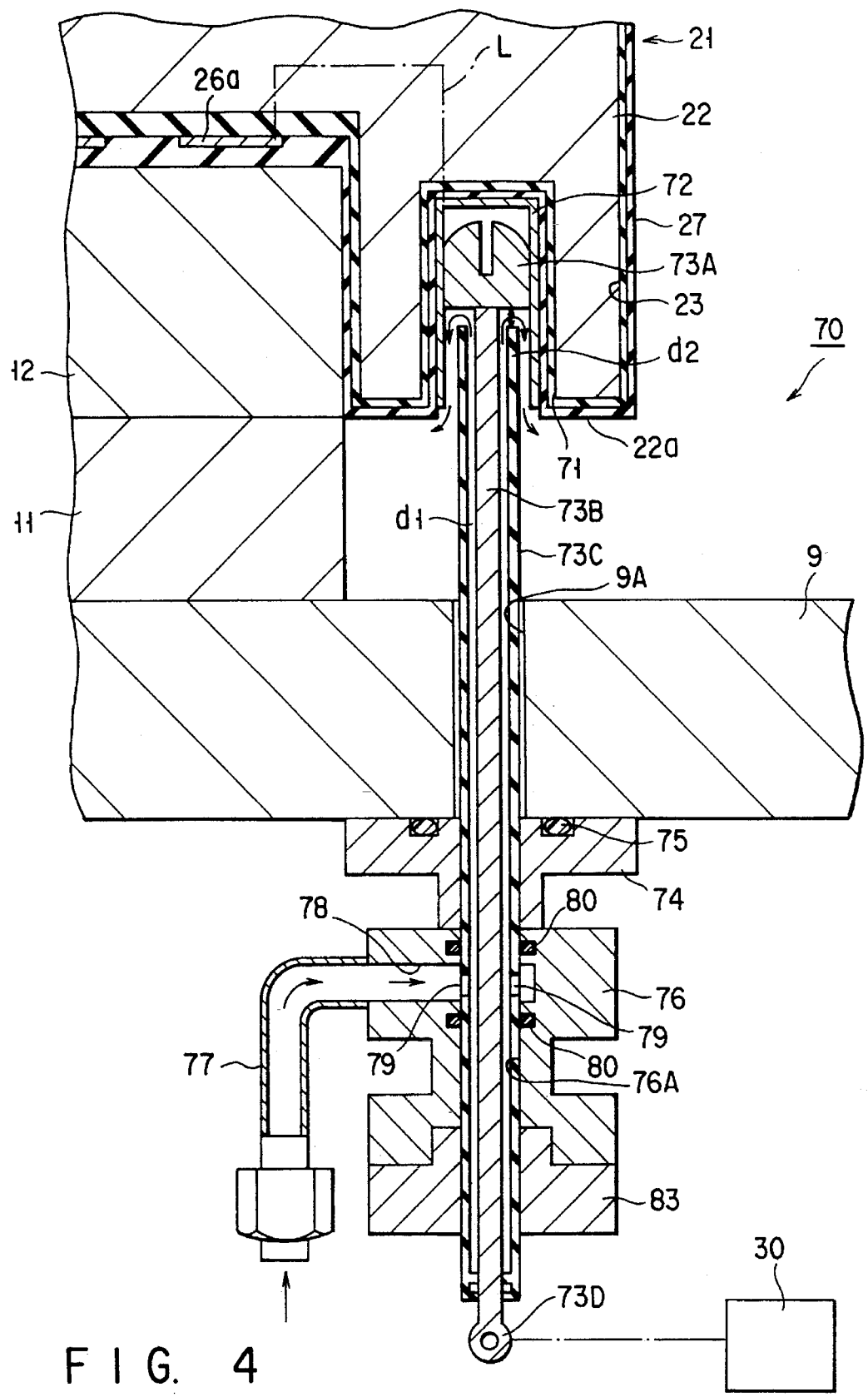
FIG. 4 is a cross-sectional view showing a power feed type connection structure.

A power feed type connection structure is so provided as to allow electric current to be supplied from the DC high-voltage power sources 28, 29 to the electroconductors 24, 25 of the electrostatic chuck S and electric current to be supplied from the AC power source 30 to the heater 26. FIG. 4 is a cross-sectional view showing the power feed type connection structure 70 for supplying the electric current to be supplied from the AC power source 30 to the heating element 26a of the heater 26. A recess 71 is provided at a proper area in the base member 22 of the mount table 21, for example, at a area surface 22a side of the base member 22. As set out above, the first insulating layer 23 and second insulating layer 27 are provided over the surface of the base member 22 including the surface of the recess 71. A receptacle terminal 72 is fitted into the recess 71. The receptacle terminal 72 is comprised of a cap-like electroconductive member with a downwardly opened bottom. The receptacle terminal 72 is electrically connected to the heating element 26a of the heater 26 by a connection line L in the base member 22.

Figure 5:
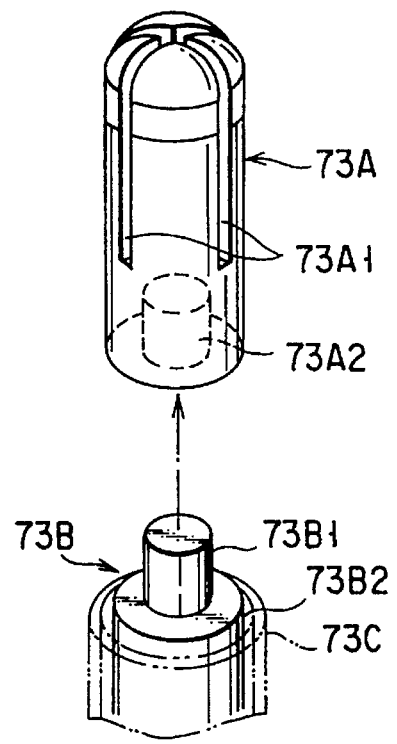
FIG. 5 is a perspective view showing a major section of a plug terminal.

A plug terminal 73 is forced into the receptacle terminal 72 and, as shown in FIG. 5, has an electro-conductive section 73A, support section 73B and insulating pipe 73C. The electroconductive section 73A has a plurality of slits $73A_1$ axially extending from a head of the plug terminal. With the plug terminal 73 forced into the receptacle terminal 72, the outer peripheral surface of the electroconductive section 73A of the plug terminal 73 is set in pressure contact with the inner wall surface of the receptacle terminal 72, so that both are set in an electroconductive state. At this time, the pressure-contacted state is favorably obtained without undue pressure due to the formation of the slits $73A_1$ in the electroconductive section 73A.

As set out above, the receptacle terminal has the recess, into which the plug terminal is forced, and contacts provided in the recess and adapted to be electrically connected to the portion of the plug terminal. By doing so, the receptacle terminal is electrically connected to the heating element 26a of the heater 26. In this example, the receptacle terminal 72, as a whole, is formed of an electro-conductive material and serves as a contact. However, at least part of the receptacle may be formed of an electroconductive material and, in this case, its electroconductive part functions as a contact. It is only necessary that an adequate electrical connection be made to the plug terminal.

The support section 73B is comprised of an electroconductive member serving to fix the electroconductive section 73A in place and allowing an electric current to be carried therethrough. A columnar projection $73B_1$ is provided at an area of the support section 73B, opposite to the electroconductive section 73A and is tightly fitted into a corresponding hole $73A_2$ in a bottom portion of the electroconductive section 73A to provide one unit of the support section 73B and electroconductive section 73A.

The support section 73B is covered with an insulating pipe 73C comprised of an insulating material, such as silicon nitride (SiN) and quartz. A clearance $d_1$ of, for example, about 0.1 mm is provided between the support section 73B and the inner wall surface of the insulating pipe 73C. Further, in the case where the projection $73B_1$ of the support section 73B is fitted into the electroconductive section 73A, a clearance $d_2$ is created between the end face of the electroconductive section 73A and that of the insulating pipe 73C.

The lower end portions of the support section 73B and insulating pipe 73C extend out of the processing chamber 2 via a hole in the bottom plate 9.

A connection line connecting section 73D is provided on the lower end of the support section 73B such that it is electrically connected to the AC power source 30.

A mounting member 74 is mounted on the outer surface of the bottom plate 9 at an outer side of the processing chamber 2, that is, at the outer atmosphere side. The mounting member 74 has an 0 ring 75 provided in the mounting member 74 relative to the bottom plate 9. The mounting member 74 is so mounted there with the support section 73B and insulating pipe 73C extending through a through hole 74A and joined in place by a fixing means such as bolts, not shown.

A gas supply attachment 76 is fitted over the outer periphery of the insulating pipe 73C at an area beneath the mounting member 74. In the gas supply attachment 76, a cavity 78 including an outer peripheral portion of the insulating pipe 73C is provided in a manner to communicate with a gas supply pipe 77. A hole 79 is provided at that portion of the insulating pipe 73C present in the cavity 78 so that the cavity 78 communicates with the clearance $d_1$ through the hole 79. 0 rings 80 are provided between the gas supply attachment 76 and the insulating pipe 73C, that is, one at the upper side and one at the lower side of the cavity 78 relative to a through hole 76A of the gas supply attachment 76, thus ensuring a hermetic seal of the cavity 78.

The gas supply pipe 77 communicating with the cavity 78 is coupled via a valve 81 and mass flow controller 82 to an inert gas supply source 76 as shown in FIG. 1. In this example, an $N_2$ gas is used as an inert gas.

A fixing member 83 is attached to the lower end of the gas supply attachment 76, as required, so as to fix the insulating pipe 3C to the gas supply attachment 76.

Although an explanation has been given of the power feed type connection structure 70 between the heating element 26a of the heater 26 and the AC current power source 30, just the same structure is used for the power feed type connection structure between the electroconductors 24, 25 of the electrostatic chucks and the DC high-voltage power sources 28, 29.

A variant of the mount table will be explained below. FIG. 6 is a cross sectional view showing a major section of the mount table in the case where the base member of the mount table is make of an insulating material. In FIG. 6, 101 shows the base member make of an insulating material, such as ceramics. The base member 101 has a configuration similar to the base member 22 of the mount table 21 as shown in FIG. 2. A recess 102 is provided at a proper place in the base member 101, for example, at a rear surface 101a side of the base member 101. An electroconductive receptacle terminal 103 is fitted in the recess 102 and is comprised of a cap-like electroconductive member of, for example, a carbon with a downward opening as one bottomed opening.

An electroconductive thin film 104 is formed on the inner wall surface of the receptacle terminal 103 in the vicinity of the opening and at the bottom surface 101a of the base member 101. A heating element 105 of a heater is provided on the surface of the electroconductive thin film 104 on the rear surface 101a side of the base member 101. Further, an insulating thin film 106 is formed on the electroconductive think film 104 including the heating element 105.

In the mount table 100 according to the above-mentioned variant, the receptacle terminal 103 and heating element 105 of the heater are electrically connected by an electroconductive think film 104.

The mount table 100 of the variant can be manufactured as will be set out below. A recess 102 is formed at a predetermined place in a base member of an insulating material. Then a receptacle terminal 103 is fitted in the recess 102 and an electroconductive thin film 104 is formed on the surface of the base member 101. The formation of the electroconductive thin film 104 is not restricted in particular, but it can be formed by depositing polysilicon by, example, a CVD method.

A heat element 105 is provided at a predetermined place on the surface of the electroconductive thin film 104. Then an insulating thin film 106 is formed on the surface of the electroconductive thin film 104 including the heat element 105. The formation of this insulating thin film 106 is not restricted in particular but it can be formed by depositing silicon oxide, for example, the CVD method.

Then the electroconductive thin film 104 and insulating thin film 106 formed on the inner wall of the receptacle terminal 103 is selectively removed by, for example, etching while leaving them only in the vicinity of an opening of the inner wall surface of the receptacle terminal 103. The above-mentioned mount table 100 is thus obtained.

The CVD apparatus 1 of the present embodiment is so constructed as set out above and now the operation, etc. of the present embodiment will be explained below.

The gate valve 51 is opened at a time when the vacuum level of the processing chamber 2 and that of the load lock chamber 52 are made equal to each other. For film formation, the wafer W is then conveyed by the conveying arm 54 over the mount table 21 within the processing chamber 2. At this time, the mount members 42a, 42b of the lifter 41 are lifted by the drive mechanisms 43a, 43b, thus placing the apparatus in a wait state. With the carrier arm 54 lowered, the wafer W is carried by the respective mount members 42a, 42b.

Then the conveying arm 54 is retracted back into the load lock chamber 52 and the gate valve 51 is closed. Then the respective mount members 42a, 42b of the lifter 41 are lowered by the drive mechanisms 43a, 43b so that the wafer W is placed on the mount table 21. When a predetermined voltage is applied from the DC high-voltage power sources 28 and 29 to the electroconductors 24 and 25, the wafer W is held on the mount table 21 under an action of the electrostatic chucks.

Then a predetermined current is supplied from the AC power source 30 to the heat element 26a and the wafer W is heated to a predetermined temperature, for example, to 600° C. The inside of the processing chamber 2 is evacuated to a predetermined reduced-pressure level, for example to 0.5 Torr and, when a $SiH_4$ gas is introduced as a process gas from the process gas introducing tube 4 into the processing chamber 2, a predetermined polysilicon film is formed on the wafer W.

During the film formation period, voltages from the DC high-voltage power sources 28, 29 are applied to the electroconductors 24, 25 in the mount table 21 in order to hold the wafer W on the mount table 21 under the action of the electrostatic chuck S. Also, in order to maintain the wafer W at a predetermined temperature, an AC current is supplied from the AC power source 25 to the heating element 26a in the mount table 21.

Further, an inert gas ($N_2$) is supplied from the inert gas supply source 83 via the mass flow controller 82, valve 81, gas supply pipe 77 and cavity 78 to the clearance $d_1$ between the support member 73B and the insulating pipe 73C.

Then the $N_2$ gas is supplied via the clearances $d_1$ and $d_2$ to an area near a contacting area (hereinafter referred to as a contacting area) between the receptacle terminal 72 and the electroconductive section 73A of the plug terminal 73. In other words, the $N_2$ gas is supplied into a space area defined, in the receptacle terminal 72, by the receptacle terminal 72 and electroconductive section 73A of the plug terminal 73. Then the $N_2$ gas is jetted into the processing chamber 2 from between the receptacle terminal 72 and the insulating pipe 73.

In this way, the SiH gas as process gas is suppressed from entering the neighborhood of the contacting area of the receptacle terminal 72 and the plug terminal 73 so that polysilicon layer is prevented from being deposited on the inner wall surface of the receptacle terminal 72 the wall surface of the electroconductive section 73A or the support section B of the plug terminal 73 in the neighborhood of the contacting area.

It is, therefore, possible to prevent leak current from flowing between the receptacle terminal 72 and plug terminal 73, and, other electroconductors, such as the support members 11, 12, in the processing chamber 2, via the polysilicon layer. As a result, a stable electric power is supplied to the electrostatic chuck S and heater 26 and it is possible to fix the wafer W in place under the electrostatic action as well as to uniformly heat the wafer W in its plane.

It is also possible to prevent the receptacle terminal 72 and plug terminal 73 from being corroded by a reaction product and the inside of the processing chamber 2 from being contaminated due to the separation of the reaction product.

Preferably the $N_2$ gas is supplied such that a pressure near or at the hole 79 of the insulating pipe 73C opened in the gas supply attachment 76 be set to 100 Torr or more. It is known that the gas-dielectric breakdown phenomenon under a reduced-pressure condition is the most prominent if under a pressure greater than 0.5 Torr but less than 100 Torr. In a reduced-pressure CVD apparatus such as the CVD apparatus of this embodiment, the process pressure greater than 0.1 Torr but less than 100 Torr is most normally applied. Thus the pressure near or at the hole 79 of the insulating pipe 73C opened in the gas supply attachment 76 is also set under the same reduced-pressure condition as set out above. Under the reduced-pressure condition, a discharge is liable to be produced between the support section 73B, in the insulating pipe 73 and an electroconductive member, such as a stainless steel pipe as the gas supply pipe 77 when electric current supply to the support section 73B.

Between the support section 73B situated in the insulating pipe 73C and an electroconductive member, such as the gas supply pipe 77 of stainless steel, situated at the marginal edge of the cavity 78 in the gas supply attachment 76, either a voltage (for example, 3 kV) of an extent applied to the electroconductors 24, 25 of the electrostatic chuck S at the mount table 21 or a voltage (for example, 200 V) of an extent applied to the heating element 26a of the heater 26 is applied to the support section 73B in the case where the pressure near or at the hole 79 is set to over 100 Torr as set out above and it is possible to secure an insulating state to an extent that no dielectric breakdown occurs. It is, therefore, possible to prevent any discharge from occurring between the support section 73B, and the electroconductive member at the marginal edge portion of the cavity 78. With the inert gas ($N_2$) supplied under such pressure condition, the wafer W is held in place under the action of the electrostatic chucks and heated in a stable way and it is possible to, as set out above, prevent the flowing of the leak current, the corrosion of the receptacle terminal 72, plug terminal 73, etc., and the contamination of the inside of the processing chamber 2. Further, it is not necessary to, even if the electroconductive member is provided at the marginal edge portion of the cavity 78, subject any insulating treatment to a surface of the electroconductive member, such as a coating of any insulating layer on the surface.

Here, the supply pressure of the inert gas, for example, is controlled in order to set the pressure, near or at the hole 79, to 100 Torr or more.

Although the $N_2$ gas has been used as the inert gas in the above-mentioned embodiment, He or An can also be used.

Although the supplying of the inert gas to the neighborhood of the contacting area of the receptacle terminal 72 and electroconductive section 73A of the plug terminal 73 has been explained as being effected via the clearance $d_1$ between the support section 73B of the plug terminal 73 and the insulating pipe 73C, the present invention is not restricted thereto.

Any other means can be used so long as the inert gas is supplied to the neighborhood of the contacting area of the receptacle terminal 72 and electro-conductive section 73A of the plug terminal 73. As evident from the above, it is possible to prevent the flowing of the leak current, the corrosion of the receptacle terminal 72, plug terminal 73, etc., and the contamination of the inside of the processing chamber 2 with the reaction products.

Although the present embodiment has been explained as being applied to the CVD apparatus, the present invention is not restricted thereto.

The present invention can be applied to various kinds of processing apparatuses, such as an etching apparatus and sputtering apparatus, adapted to perform processing in the processing chamber under a reduced-pressure condition and equipped with associated units, such as an electrostatic chuck and heater, to which electric power is fed from an outer source.

What is claimed is:

1. A processing apparatus comprising:

a processing chamber for processing an object in a vacuum;

a mount member provided in the processing chamber and having an object placing surface;

an electric power receiving unit for receiving an electric power upon the processing of the object;

a receptacle terminal having a recess and contacts provided in the recess and electrically connected to the electric power receiving unit;

a plug terminal capable of being forced into the recess of the receptacle terminal and electrically connected to the contact when being forced into the recess of the receptacle terminal; and inert gas supplying means for supplying an inert gas to a region near a mutually contacting area of the contact of the receptacle terminal and plug terminal.

2. The processing apparatus according to claim 1, wherein the electric power receiving unit is comprised of a heating element provided in the mount member.

3. The processing apparatus according to claim 1, wherein the electric power receiving unit is comprised of an electrostatic chuck provided at the object placing surface of the mount member to hold the object.

4. The processing apparatus according to claim 1, wherein the plug terminal comprises an electroconductive section which, when the plug terminal is forced into the recess of the receptacle terminal, is contacted with the contact of the receptacle terminal, an electroconductive support section for supporting the electroconductive section and an insulating member arranged around the support section; and the inert gas supply means has a clearance defined between the support section and the insulating member and having an open end near the electroconductive section and a gas supply passage whose one end is connected to the clearance and through which the inert gas flows, and an inert gas supply source connected to the other end of the gas supply passage.

5. The processing apparatus according to claim 4, wherein a pressure at an area at which the inert gas flows from the gas supply passage into the clearance is 100 Torr or more.

6. The processing apparatus according to claim 4 wherein the support section is connected at one end to the electroconductive section and comprised of a substantially columnar electroconductor and the insulating member is comprised of a substantially cylindrical member having an inner diameter greater than an outer diameter of the columnar electro-conductor, said insulating member is arranged around the support section and,the clearance is defined between the conductor and the insulating member.

7. The processing apparatus according to claim 4 wherein the gas supply passage comprises a connector having a through hole through which the support section and insulating member and passed, a cavity including an outer peripheral portion of the insulating member and an opening connecting the cavity to an outside of said connector, a hole formed in the insulating member, through which the cavity communicates with the clearance, and a gas supply pipe connected to the opening.

8. The processing apparatus according to claim 7, wherein a pressure near or at the hole is set at 100 Torr or more.

* * * * *